(12) United States Patent
Lai et al.

(10) Patent No.: US 6,440,798 B1
(45) Date of Patent: Aug. 27, 2002

(54) METHOD OF FORMING A MIXED-SIGNAL CIRCUIT EMBEDDED NROM MEMORY AND MROM MEMORY

(75) Inventors: Erh-Kun Lai, Tai-Chung Hsien; Chien-Hung Liu, Taipei; Shou-Wei Huang, Chi-Lung; Shyi-Shuh Pan, Kao-Hsiung; Ying-Tso Chen, Kao-Hsiung Hsien, all of (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/682,148

(22) Filed: Jul. 26, 2001

(51) Int. Cl.$^7$ .............................................. H01L 21/336
(52) U.S. Cl. ...................................... 438/266; 438/270
(58) Field of Search ............................... 438/257, 259, 438/262, 266, 267, 269, 270, 289, 680, 692, 954

(56) References Cited

U.S. PATENT DOCUMENTS 5,780,341 A * 7/1998 Ogura ........................ 438/259
6,177,703 B1 * 1/2001 Cunningham ............... 257/321

* cited by examiner

Primary Examiner—David Nelms
Assistant Examiner—David Nhu
(74) Attorney, Agent, or Firm—Winston Hsu

(57) ABSTRACT

The present invention gives a method for creating a NROM memory from a semiconductor substrate. Numerous process steps are included to achieve this including forming shallow trench isolation areas, many ion implantation processes, ROM code implantation processes, photolithography and creation of layers and removal of layers. At the end of the process a mixed-signal circuit embedded NROM and NROM memory are created.

10 Claims, 23 Drawing Sheets

METHOD OF FORMING A MIXED-SIGNAL CIRCUIT EMBEDDED NROM MEMORY AND MROM MEMORY

BACKGROUND OF THE INVENTION

1. Field of the Invention

The present invention relates to a method of forming a system on chip(SOC),and more particularly, to a method of forming a mixed-signal circuit system on chip embedded with nitride read only memory(NROM) and mask read only memory(MROM). The read only memory is formed by ROM coding a portion of nitride read only memory.

2. Description of the Prior Art

Recently, due to the increasing requirement of low energy consumption and PC-embedded consumer information apparatus" (IA), together with the upgrading of semiconductor manufacturing techniques, the design of system on chip(SOC) has become a trend. System on chip integrates and manufactures conventional and various chip units, such as central processing unit(CPU), micro controller unit (MCU), memory, periphery circuit, mixed signal circuit, digital signal processor(DSP), and network IC in a single chip. The advantage of system on chip includes higher efficiency, better reliability and lower cost.

In U.S. Pat. No. 5,403,764, Yamamoto et al. proposes a method of flash ROM embedded with read only memory. Yamamoto utilizes two ion implantation processes to implant dopant into the silicon substrate in the read only memory area in order to alter the threshold voltage of read only memory. After completion of writing "0" and "1" into the read only memory, the conventional flash ROM manufacturing process, such as floating gate, inter-poly insulating layer and control gate, is performed.

Please refer to FIG. 1 to FIG. 4, of the method Yamamoto et al. proposes comprising the following steps: (a). Form an isolation layer 4 on a substrate 1; (b). Form field oxide layers 8 in order to isolate each memory cell; (c). Form a dopant area 10 in order to write in "1" in the read only memory; (d). Form a dopant area 11 in order to write in "0" in predetermined address. (e). Form a floating gate 5, inter-poly insulating layer 6 and a control gate 7; and (f). Form drain 2 and source 3.

Although Yamamoto et. al proposed the method of forming flash ROM embedded read only memory, the cost of a flash ROM with a stacking gate according to the prior art is still too high, and the process is very complex. Therefore a nitride read only memory with a similar function to flash ROM and having a lower cost instead of the conventional stacking gate flash ROM becomes a feasible idea. Read only memory is originally developed by Saifun Semiconductors Ltd. of Israel, with the structure and manufacturing method referred to in U.S. Pat. No. 5,966,603.

Strictly speaking, nitride read only memory is practically a kind of non-volatile memory, or more definitely, a kind of electrically erasable and programmable read only memory (EEPROM). The primary feature of the nitride read only memory structure is it utilizes an insulation dielectric layer composed of silicon nitride as a charge trapping medium. Since the silicon nitride layer is highly densified, the hot electrons tunneling through oxide layer will enter the silicon nitride layer and become trapped inside it. Flash ROM on the other hand, utilizes a polysilicon floating gate to store charges.

However, up to now there has been no disclosed prior art or essay which mentions a method of forming the mixed-signal circuit embedded with nitride read only memory and mask read only memory.

SUMMARY OF THE INVENTION

It is therefore a primary objective of the present invention to provide a method of forming a system on chip(SOC), the system on chip embedded with a nitride read only memory area, a mask read only memory area, a periphery area and a mixed-signal area and its manufacturing method.

It is therefore another objective of the present invention to provide a method of forming a mixed-signal circuit system on chip embedded with nitride read only memory and mask read only memory, the method comprising manufacturing analog devices, such as a capacitor with ONO/NO to function as an inter-poly insulating layer and resistor device.

In the first preferred embodiment of the present invention, the method comprises: (1). Providing a semiconductor substrate, the surface of the semiconductor substrate divided into a memory area, a low voltage device area, a high voltage device area and a mixed-signal area; (2). Performing a shallow trench isolation process in order to form a plurality of shallow trench isolation areas on the surface of the semiconductor substrate for isolating devices; (3). Forming a bottom electrode of the capacitor atop the shallow trench isolation area in the mixed-signal circuit area; (4).Creating an ONO layer on the surface of the semiconductor substrate that covers the bottom electrode of the capacitor; (5). Forming a plurality of buried bit lines in the semiconductor substrate in the memory area; (6). Simultaneously forming an oxide layer atop each buried bit line and a gate oxide layer on the surface of the semiconductor substrate in the low voltage device area; (7). Depositing a polysilicon(PL1) layer on the semiconductor substrate; (8). Performing a photolithography and etching process in order to simultaneously form a plurality of bit lines in the memory area, a gate for low voltage MOS transistor in the low voltage device area; a gate for high voltage MOS transistor in the high voltage device area, a top electrode of the capacitor and a resistor in the mixed-signal circuit area; and (9). Performing a ROM code implantation process to a portion of the memory cells in the memory area in order to form a read only memory area.

It is an advantage of the present invention to utilize a nitride read only memory instead of the conventional stacking gate flash ROM. Therefore not only the cost can be reduced but also the manufacturing process can be simplified.

These and other objectives of the present invention will no doubt become obvious to those of ordinary skill in the art after having read the following detailed description of the preferred embodiment that is illustrated in the various figures and drawings.

DETAILED DESCRIPTION

The present invention discloses a method of forming a system on chip, the method integrates the process for nitride read only memory, the process for high/low voltage MOS transistor devices and the process for analog devices, such as capacitors and resistors. The method proposed in the present invention is different to the prior art method, the capacitor device on the system on chip according to the present invention can be a polysilicon-to-polysilicon capacitor, or a polysilicon-to-metal capacitor (that is the capacitor with polysilicon as a top electrode and metal as a bottom electrode). This is because the present invention integrates the process of nitride read only memory which has a simpler structure compared to the stacking gate flash read only memory according to the prior art, and the bottom electrode of the capacitor can be made at the beginning of the process.

Figure 1:
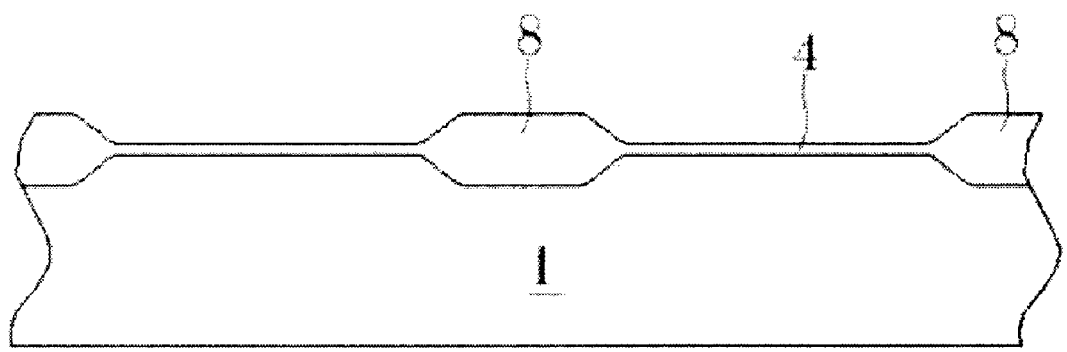
FIG. 1 to FIG. 4 are schematic diagrams of a process for forming a flash read only memory chip embedded with read only memory according to the prior art.
Figure 2:
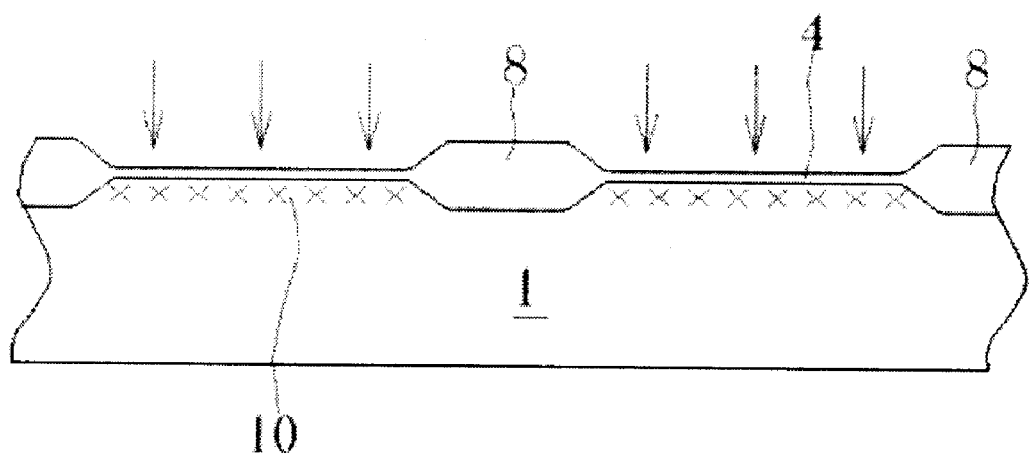
Figure 3:
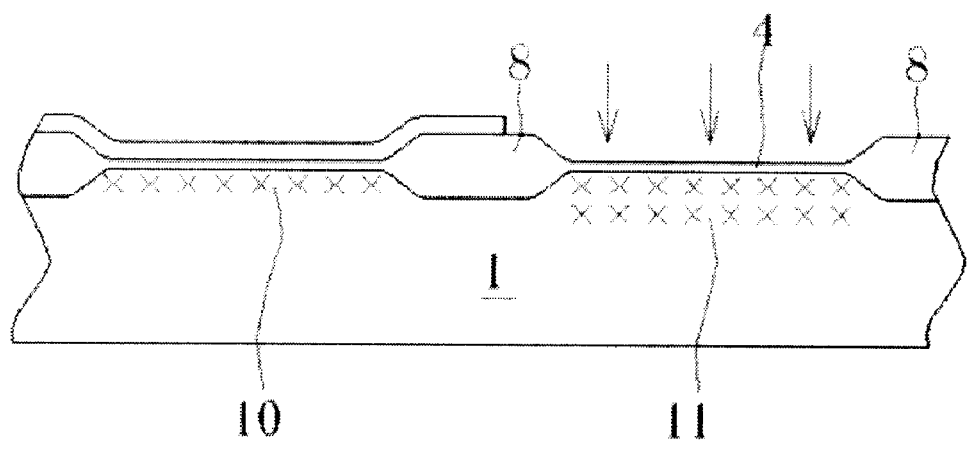
Figure 4:
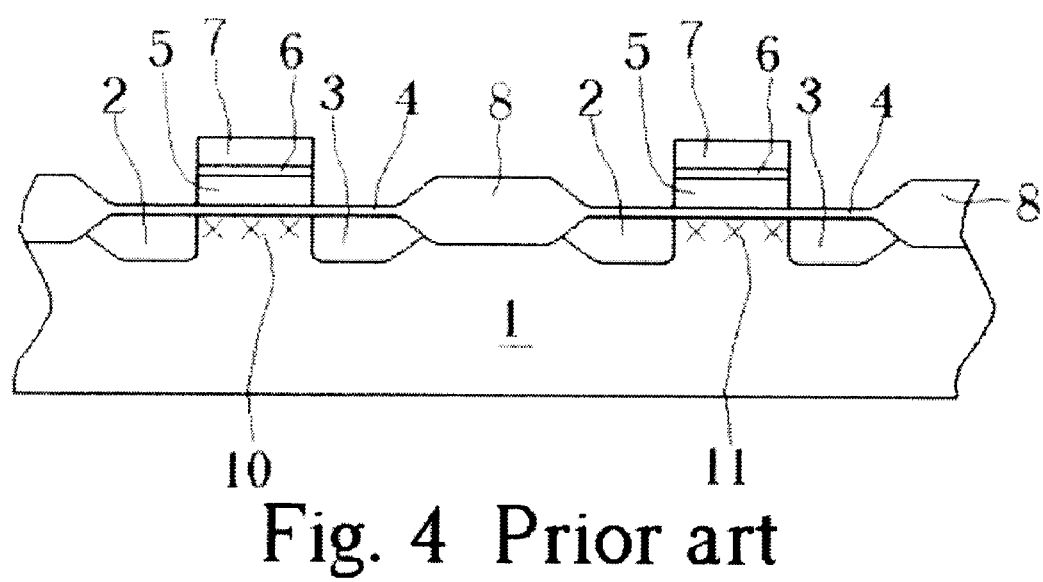
Figure 5:
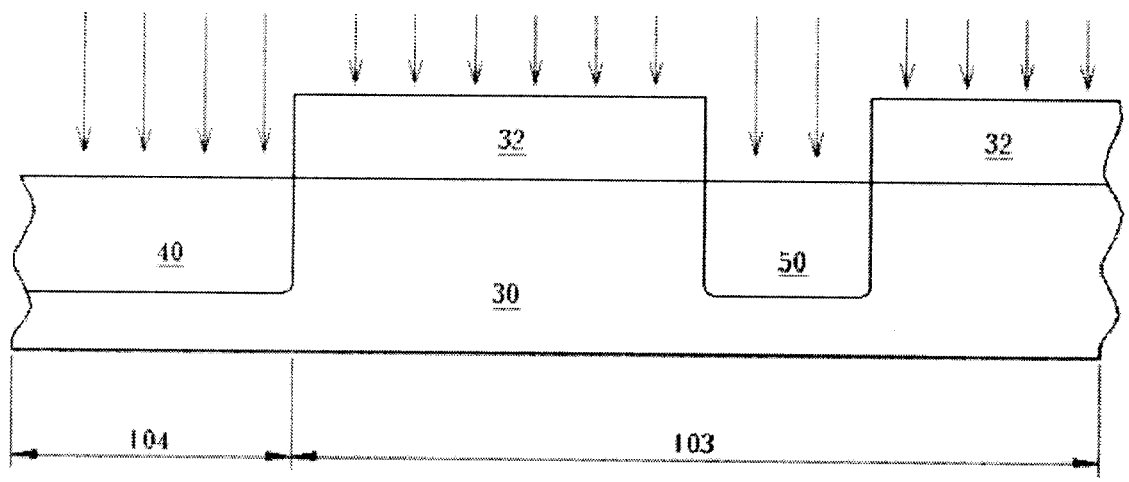
FIG. 5 to FIG. 23 are schematic diagrams of a process for forming a mixed-signal circuit system on chip embedded with nitride read only memory and mask read only memory.

Please refer to FIG. 5 to FIG. 23. FIG. 5 to FIG. 23 are schematic diagrams of a process for forming the mixed-signal circuit system on chip embedded with nitride read only memory and mask read only memory according to the present invention. As shown in FIG. 5, firstly a P type silicon substrate 30 comprising a periphery area 103 and a memory area 104 is provided. Then a photoresist layer 32 is formed on the surface of the silicon substrate 30, and the photoresist layer 32 defines an N well area. Thereafter an ion implantation process forms an N well area 40 in the silicon substrate 30 in the memory area 104 and an N well area 50 in the silicon substrate 30 in the periphery area 103. The photoresist layer 32 is then removed. Usually a thermal process, such as rapid thermal annealing(RTA) process, after the ion implantation process, will activate or drive in the dopants implanted into the silicon substrate 30 and attain the required profile.

Figure 6:
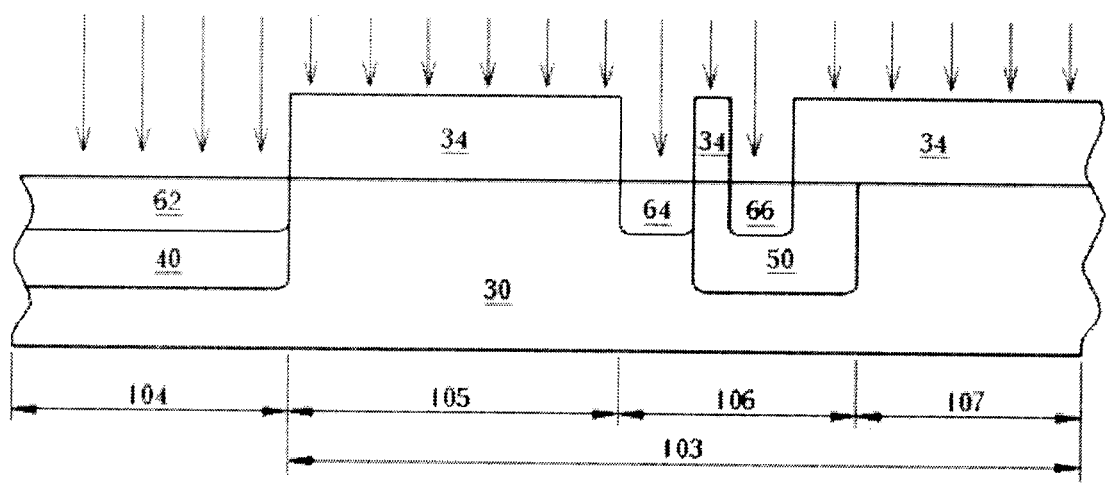

As shown in FIG. 6, a photoresist layer 34 is formed on the silicon substrate 30 with the photoresist layer 34 defining the P well area. Thereafter, an ion implantation process forms a P well area 62 in the N well area 40 in the memory area 104 and P well areas 64, 66 in the silicon substrate 30 in the periphery area 103, and the P well area 66 formed in the N well area 50. At this time, the periphery area 103 is divided into a low voltage device area 105, a high voltage device area 106 and a mixed signal circuit device area 107. P well area 64, 66 and N well area 50 are formed in the high voltage device area 106.

Figure 7:
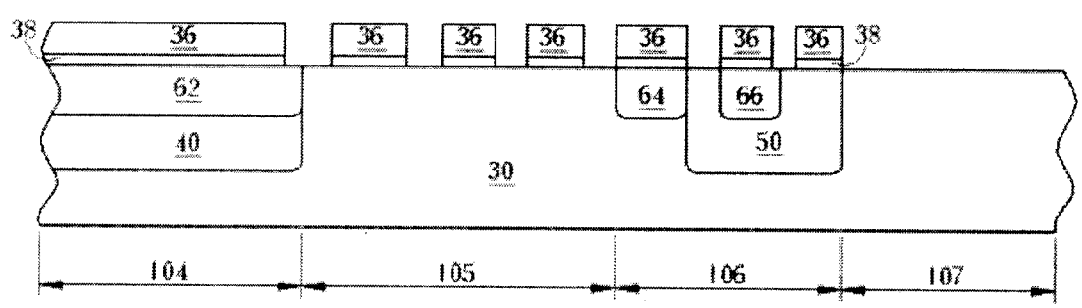
Figure 8:
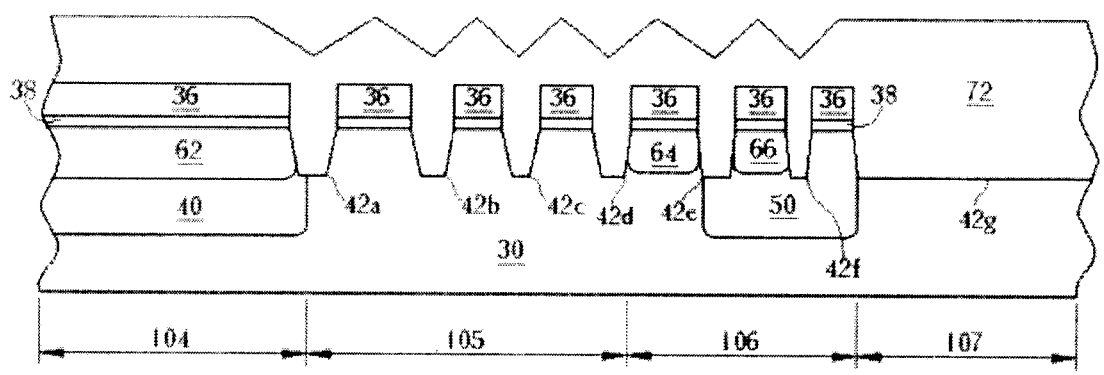
Figure 9:
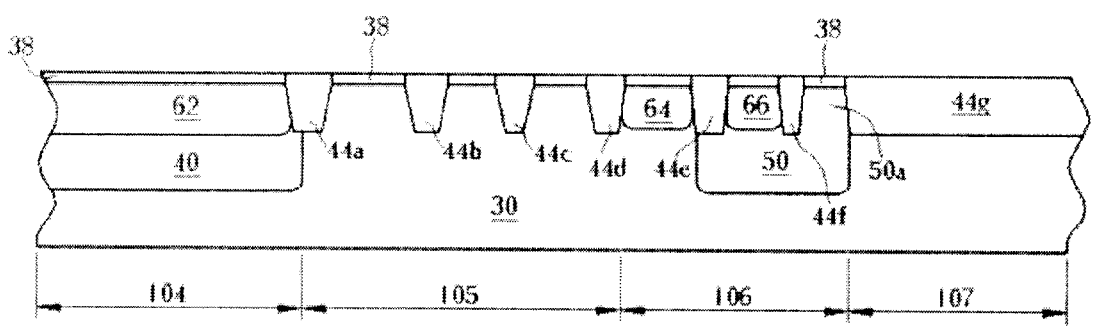

As shown in FIG. 7, a shallow trench isolation process forms a pad oxide layer 38 and a silicon nitride layer 36 on the surface of the silicon substrate 36. The pad oxide layer 38 with a thickness ranging from 100 to 200 angstrom(Å) can be formed by utilizing thermal oxidation. The silicon nitride layer 36 with a thickness ranging from 800 to 1600 angstroms is formed by chemical vapor deposition(CVD). Thereafter a photolithography and etching process define the sites for shallow trench isolation in the silicon nitride layer 36. As shown in FIG. 8, following that another etching process is performed to etch the silicon substrate 30 not covered by the silicon nitride layer in order to form isolation trench 42a, 42b, 42c, 42d, 42e, 42f, 42g as isolating devices. High density plasma chemical vapor deposition(HDPCVD) forms a HDP oxide layer 72 in each shallow isolation trench. As shown in FIG. 9, thereafter chemical mechanical polishing(CMP) planarizes the HDP oxide layer 72. The silicon nitride layer 36 is then removed and the shallow trench isolation areas 44a, 44b, 44c, 44d, 44e, 44f, 44g are complete. The shallow trench isolation area 44f isolates the P well area 66 and N well area 50a in N well area 50.

Figure 10:
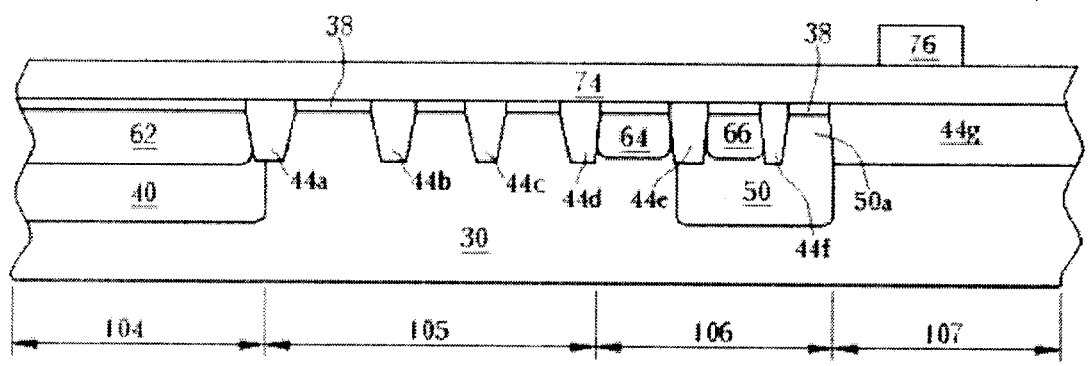
Figure 11:
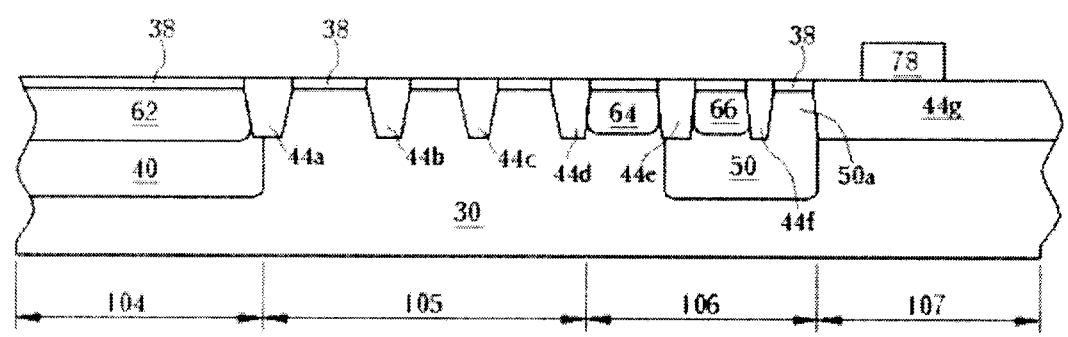

As shown in FIG. 10, a conductive layer 74 is then formed on the silicon substrate 30. In the first preferred embodiment of the present invention, the conductive layer 74 is an in-situ doped polysilicon layer with the dopant concentration approximately 1E21 $cm^{-3}$. However in another preferred embodiment of the present invention, the conductive layer 74 can be comprised of other conductive materials, such as metal. Conductive layer 74 is taken as the bottom electrode of the capacitor in subsequent process, and its thickness depends on the material of the conductive layer 74 and design criteria of the capacitor. Thereafter a photoresist layer 76 is formed on the conductive layer 74. The photoresist layer 76 defines the sites of the bottom electrode of the capacitor in the mixed signal circuit area 107. As shown in FIG. 11, after that by anisotropically dry etching the conductive layer 74 not covered by the photoresist layer 76, a bottom electrode 78 of the capacitor atop the shallow trench isolation area 44g is formed in the mixed-signal circuit area 107.

Figure 12:
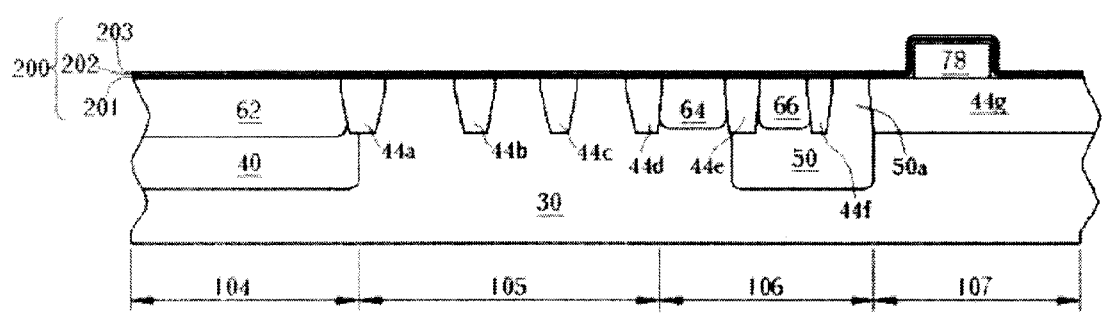

As shown in FIG. 12, the pad oxide layer 38 is removed and thereafter an ONO process is performed in order to form an ONO layer 200 on the silicon substrate 30. In the preferred embodiment of the present invention, the ONO process comprises firstly forming an oxide layer 201 with a thickness ranging from 50 to 150 angstroms on the surface of the silicon substrate 30 and taking it as the bottom oxide layer of the ONO layer 200 by utilizing a low temperature oxidation process with a temperature ranging from 750° C. to 1000° C. The oxide layer 201 is used as a tunneling oxide layer of the nitride read only memory in the memory area 104. After that a low pressure chemical vapor deposition (LPCVD) process deposits a silicon nitride layer 202 with a thickness ranging from 80 to 250 angstroms on the surface of the bottom oxide layer 201, and the silicon nitride layer 202 is taken as the charge trapping layer. Finally an annealing process with a process time ranging from 10 to 30 minutes repairs the structure of the silicon nitride layer 202, and water vapor is input to perform a wet oxidation process in order to form a silicon oxy-nitride layer 203 with a thickness ranging from 50 to 200 angstroms used as the top oxide layer of the ONO layer 200 on the surface of the silicon nitride layer 202. During the growth of the top oxide layer 203, approximately 25 to 100 angstroms silicon nitride layer 202 is consumed and the bottom oxide layer 201, silicon nitride layer 202 and the top oxide layer 203 on the surface of the silicon substrate 30 are termed as the ONO layer 200. Moreover, other ONO processes can be applied to the present invention, such as tubular type oxidation. The ONO layer formed in the low voltage device area 105 and the high voltage device area 106 are removed in the subsequent process. As shown in FIG. 12, the ONO layer 200 is simultaneously formed atop the surface of the bottom electrode 78 of the capacitor, therefore the capacitor in the present invention has an ONO insulation layer. Furthermore, in another preferred embodiment of the present invention, if the bottom electrode of the capacitor is comprised of metal, the insulation layer of the capacitor is a NO layer rather than an ONO layer.

Figure 13:
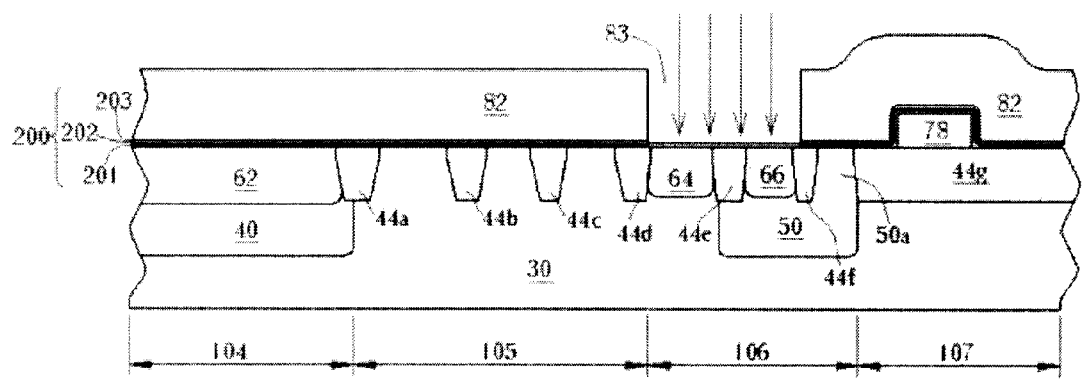

As shown in FIG. 13, a photoresist layer 82 is formed on the ONO layer 200 having an opening 83 exposing the P well area 64, 66 in the high voltage device area 106. Then, the ONO layer 200 in the open 83 is etched to remove the silicon nitride layer 202 and the top oxide layer 203 in the ONO layer 200 atop the P well area 64,66 in the high voltage device area 106. Thereafter, an N type ion implantation process is performed one or two times to adjust the threshold voltage of the NMOS high voltage device in the high voltage device area 106, and the photoresist layer 82 is then removed.

Figure 14:
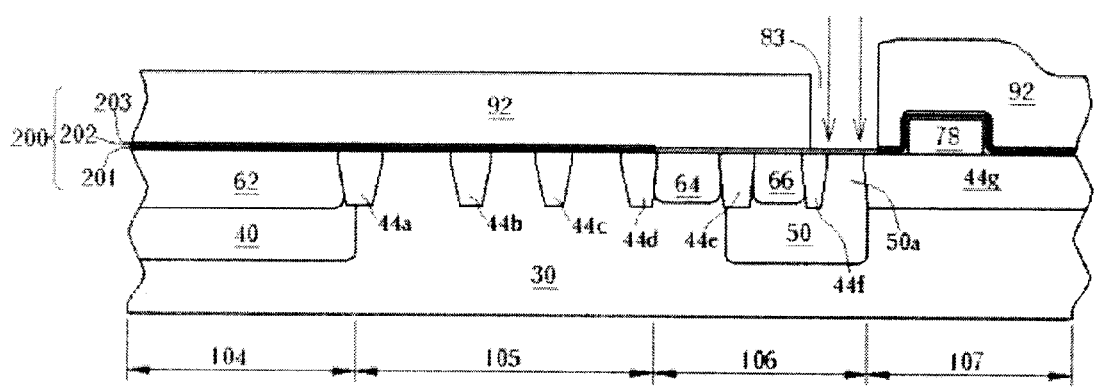

As shown in FIG. 14, a photoresist layer 92 on the ONO layer 200 having an open 93 exposing the N well area 50a in the high voltage device area, is formed. Following that the ONO layer 200 in the open 93 is etched, in order to remove the top oxide layer 203 and the silicon nitride layer 202 in the ONO layer 200 atop the N well area 50a in the high voltage device area 106. Thereafter a P type ion implantation process adjusts the threshold voltage of the PMOS high voltage device in the high voltage device area 106, and after the photoresist layer 92 is removed.

Figure 15:
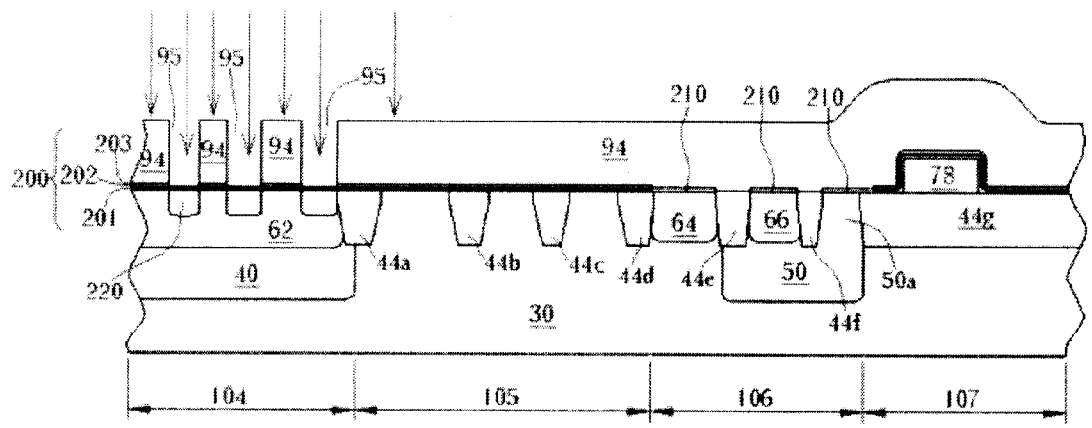

Please refer to FIG. 15, after completing the adjustment of the threshold voltage in the high voltage device area 106, a gate oxide layer 210 is formed on the surface of the silicon substrate 30 in the high voltage device area 106. Then a photoresist layer 94 is formed on the surface of the silicon substrate 30. The photoresist layer 94 covers the low voltage device area 105, the high voltage device area 106 and the mixed-signal circuit area 107, and has a plurality of opens 95 in the memory area 104. The opens 95 define the sites for forming the buried bit line in the memory area 104. Thereafter the ONO layer exposed in the memory area 104 is etched, and a bit line ion implantation process by utilizing arsenic(As) or other N type dopants dopes the silicon substrate 30 not covered by the photoresist layer 94 in the memory area 104 in order to form a plurality of N type doping areas 220 in the silicon substrate 30 and is taken as the buried bit lines of the memory cell, or termed as buried drain or source. The distance between the two neighboring doping area is a channel length. In the ion implantation process, a typical arsenic ion dosage is approximately 1E15 to 1E16 atomes/cm$^2$, the implantation energy is approximately 20 to 80 KeV with the optimum 50 KeV. After that a rapid thermal annealing process with temperature ranging from 800 to 1000° C., activates the dopants implanted in the silicon substrate 30. The photoresist layer 94 is then removed.

Moreover, it is suggested to perform an angled pocket ion implantation process optionally before performing the bit line ion implantation process in order to form a P$^-$ type pocket doping area(not shown) in the silicon substrate 30 in the memory area 104. The angled ion implantation process utilizes BF$^{2+}$ as a dopant, the dosage approximately 1E13 to 1E15 ions/cm$^2$, the implantation energy between 20 and 150 KeV, and the incident angle to the silicon substrate 30 approximately 20 to 45°.

Under this process condition, the highest concentration for the BF$^{2+}$ dopants implanted into the silicon substrate 30 is located in the silicon substrate 30 underneath the channel at a depth ranging from between 600 and 1000 angstroms approximately, with the horizontal distance underneath the channel ranging from 100 to 1000 angstroms approximately. The objective for forming P$^-$ type pocket doping area is to provide a high electric field area at one side of the channel, the high electric field area will enhance the hot carriers effect, thus improving the velocity when passing through channel under programming. In other words, accelerate the electrons in order to make more electrons acquire enough dynamic energy by way of collision or scattering effect to tunnel through bottom oxide layer 201 and penetrate into silicon nitride layer 202 and so further enhance the writing efficiency.

Figure 16:
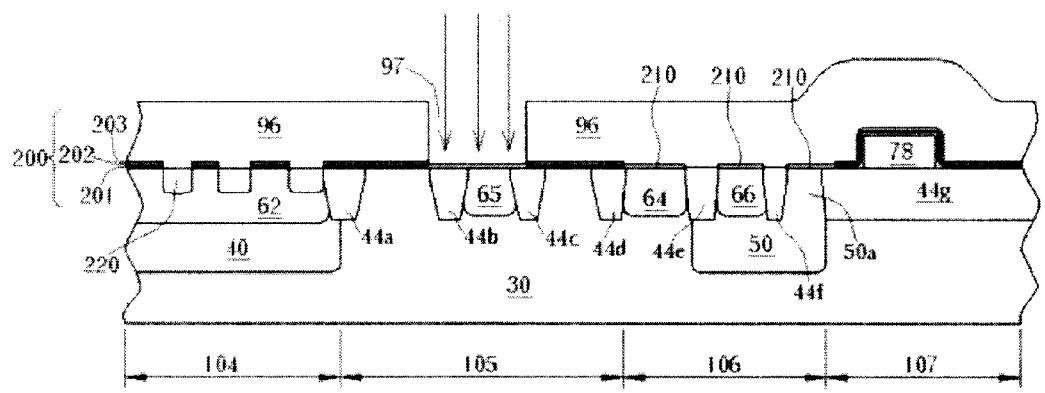

As shown in FIG. 16, a photoresist layer 96 is then formed on the surface of the silicon substrate 30. The photoresist layer 96 has an open 97 exposing the site for forming a P well area in the low voltage device area 105. Thereafter the ONO layer 200 in the open 97 are etched in order to remove the silicon nitride layer 202 and the top oxide layer 203 in the open 97 in the low voltage device area 105. After that one or several P type ion implantation processes form P well area 65. Lastly the photoresist layer 96 is removed.

Figure 17:
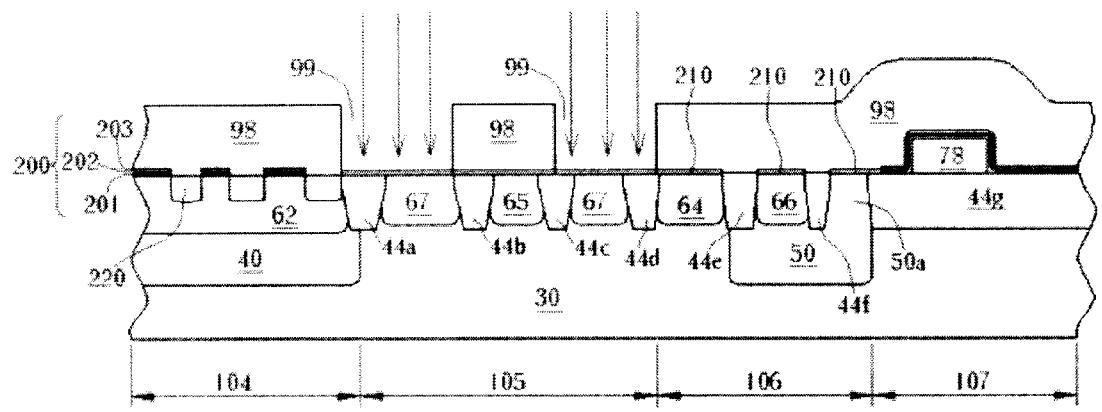

As shown in FIG. 17, photoresist layer 98 is formed on the surface of the silicon substrate 30, with the photoresist layer 98 having an open 99 exposing the sites for forming an N well area in the low voltage device area 105. Thereafter the ONO layer 200 in the open 99 is etched in order to remove the silicon nitride layer 202 and the top oxide layer 203 in the open 99 in the low voltage device area 105. One or several N type ion implantation processes form an N well area 67. Lastly the photoresist layer 98 is removed.

Figure 18:
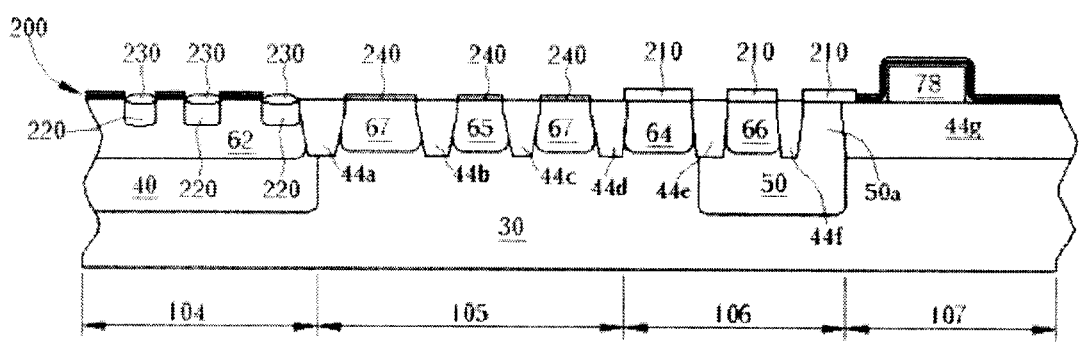

As shown in FIG. 18, a thermal oxidation process is performed in order to simultaneously form a buried drain oxide layer 230 atop the buried bit lines 220 in the memory area 104, and a gate oxide layer 240 with a thickness ranging from 100 to 250 angstroms in the low voltage device area 105. The thickness of the gate oxide layer 240 in the low voltage device area 105 is less than the gate oxide layer 210 in the high voltage device area 106. In another preferred embodiment of the present invention, gate oxide layers with various thicknesses can be formed by only adding a photolithography and thermal oxidation process.

Figure 19:
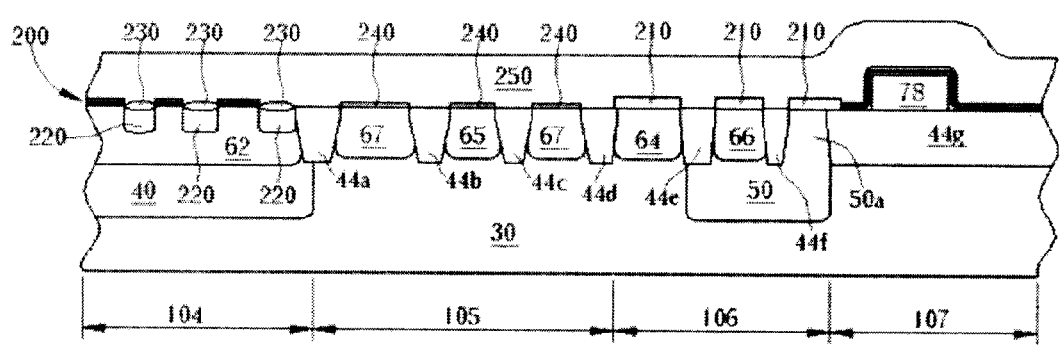

Thereafter as shown in FIG. 19, a polysilicon(PL1) layer 250 is deposited atop the memory area 104, the low voltage device area 105, the high voltage device area 106 and the mixed signal circuit area 107. In another preferred embodiment of the present invention, a polysilicide layer can be further formed on the surface of the polysilicon layer 250. The polysilicon layer 250 functions to form a top electrode of the capacitor and the resistor device in the mixed signal circuit area 107, gates for the MOS transistors in the high voltage device area 106 and the low voltage device area 105, and word lines of the nitride read only memory in the memory area 104 in subsequent process steps.

Figure 20:
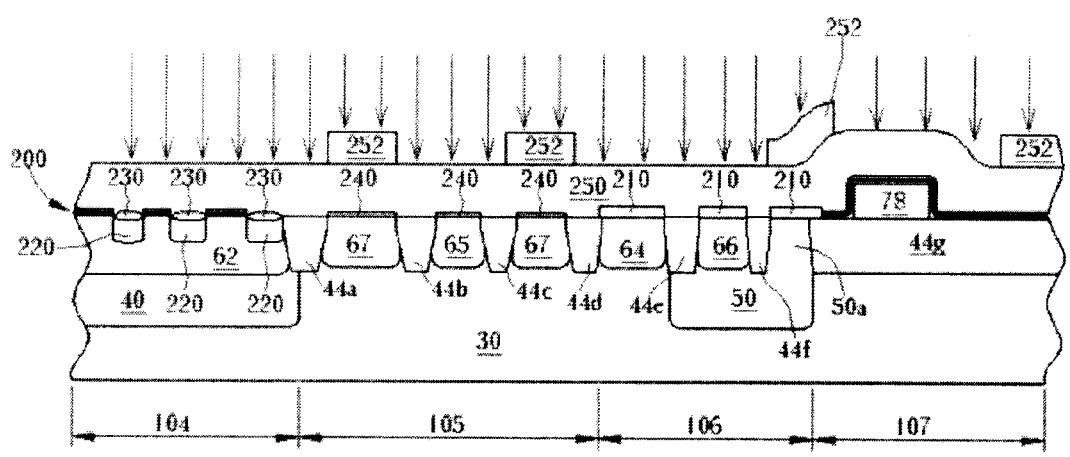

As shown in FIG. 20, following that a photoresist layer 252 is formed on the polysilicon layer 250. The photoresist layer 252 covers the N well area 67 in the low voltage device area 105, the N well area 50a in the high voltage device area 106 and the resistor area in the mixed signal circuit area 107, and exposes other areas.

Thereafter, an anti-depletion poly(ADP) ion implantation process implants a predetermined dosage N type dopant, such as phosphorous or arsenic into the polysilicon layer 250 not covered by the photoresist layer 252. After the ADP ion implantation process, it is advised to perform an annealing process. The photoresist layer 252 is then removed.

Figure 21:
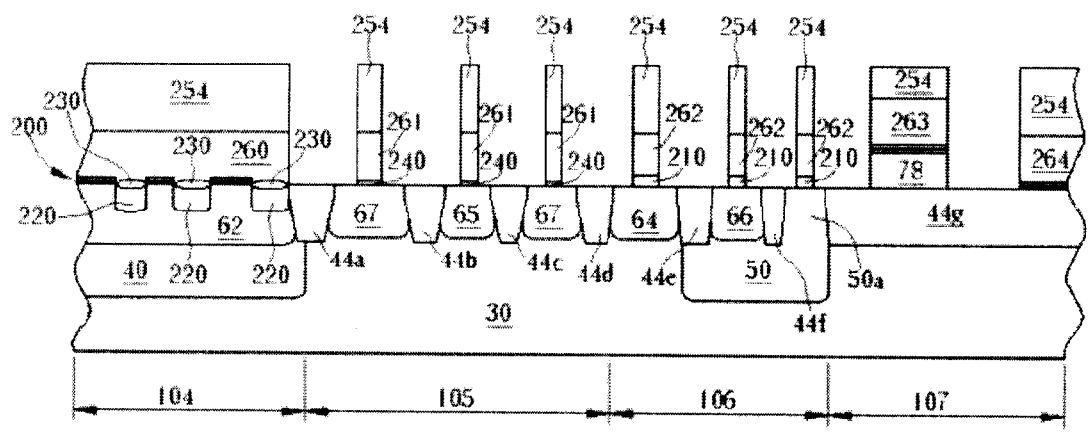

As shown in FIG. 21, a photolithography process forms a photoresist layer 254 on the surface of the polysilicon layer 250 in order to simultaneously define the site for word line in the memory area 104, the site of the gate for the low voltage MOS transistor in the low voltage device area 105, the site of the gate for the high voltage MOS transistor in the high voltage device area 106, and the sites of the top electrode of the capacitor and the resistor in the mixed signal circuit area 107. After, a dry etching process to remove the polysilicon layer 250 not covered by the photoresist layer 254 in order to simultaneously form word line 260 in the memory area 104, the gate 261 for a low voltage MOS transistor in the low voltage device area 105, the gate 262 for the high voltage MOS transistor in the high voltage device area 106, and the top electrode 263 of the capacitor and the resistor 264 in the mixed signal circuit area 107. Finally the photoresist layer 254 is removed. It is advised to perform an annealing process after the etching process.

Figure 22:
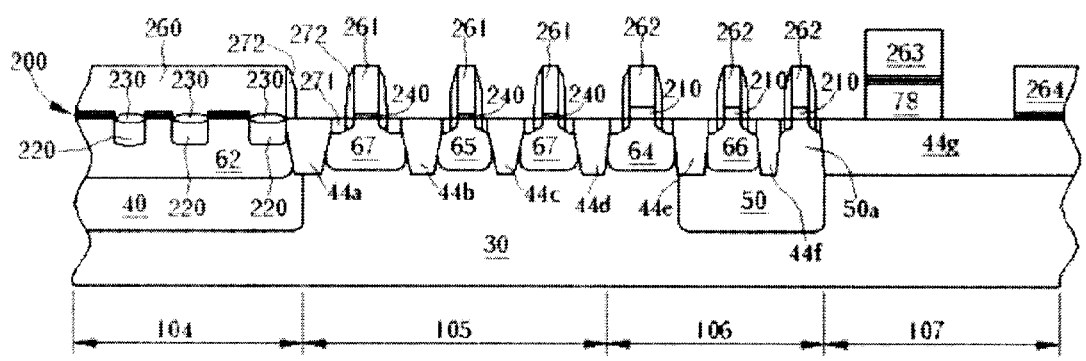

As shown in FIG. 22, photolithography and ion implantation process are employed several times in order to form the source/drain 271 of the MOS transistors in the low voltage device area 105 and the high voltage device area 106 respectively. Since the manufacturing of the MOS device, such as the lightly doped drain(LDD), the spacer 272 and the source/drain is obvious to those skilled in the art, the detailed steps will not be mentioned here.

Figure 23:
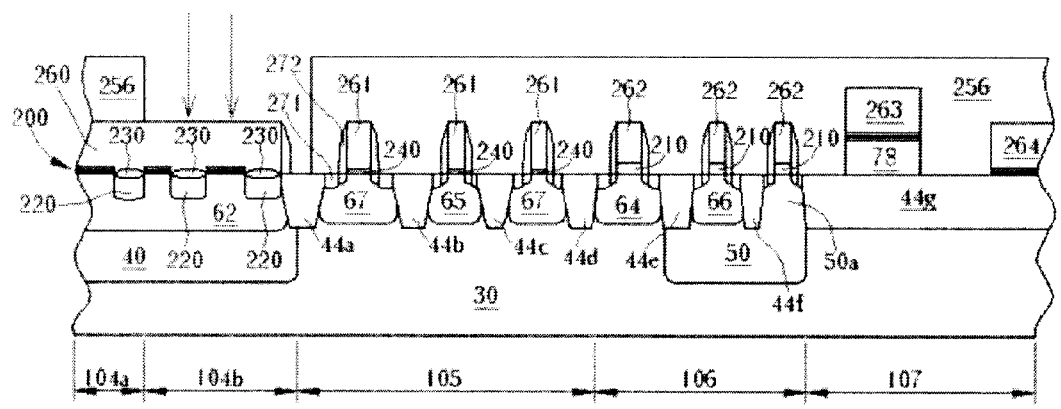

Thereafter as shown in FIG. 23, a photoresist layer 256 to covers the low voltage device area 105, the high voltage device area 106, the mixed signal circuit area 107 and part of the memory area 104. The photoresist layer 256 only exposes the area for ROM coding in the memory area 104. Up to this point in the process, the memory area 104 is divided into a nitride read only memory area 104a and a mask read only memory area 104b, and the pre-mentioned area for ROM coding is in the mask read only memory area 104b. A ROM code B/BF$_2$ ion implantation creates a high threshold voltage and low threshold voltage memory cell in the mask read only memory area 104b, which represent 0 or 1 respectively so as to achieve the objective of storing information or data.

Compared to the prior art method of forming the flash ROM chip embedded with read only memory, the mixed signal circuit system on chip according to the present invention simultaneously embedded with nitride read only memory, mask read only memory and high/low voltage MOS device. Moreover, the capacitor device according to the present invention can utilize the conductive material composed of non polysilicon as the bottom electrode of the capacitor, and the top electrode of the capacitor is simultaneously formed with the word line of the nitride read only memory.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a system on chip (SOC), the method comprising:

providing a semiconductor substrate, the surface of the semiconductor substrate divided into a memory area, a low voltage device area, a high voltage device area and a mixed-signal circuit area;

performing a shallow trench isolation process to form a plurality of shallow trench isolation areas for isolating devices;

forming a bottom electrode of a capacitor atop the shallow trench isolation area in the mixed-signal circuit area;

forming an ONO dielectric layer on the surface of the semiconductor substrate, the ONO dielectric layer covering a bottom electrode of the capacitor;

forming a plurality of buried bit lines in the semiconductor substrate in the memory area;

simultaneously forming an oxide layer atop each buried bit line and a gate oxide layer on the surface of the semiconductor substrate in the low voltage device area;

depositing a polysilicon (PL1) layer on the surface of the semiconductor substrate;

performing a photolithography and etching process to form a plurality of bit lines in the memory area, a gate for a low voltage MOS transistor in the low voltage device area, a gate for a high voltage MOS transistor in the high voltage device area, a top electrode of the capacitor, and a resistor in the mixed-signal circuit area; and performing a ROM code implantation process to a portiona portion of the memory devices in the memory area so as to form a read only memory (ROM) area.

2. The method of claim 1 wherein the semiconductor substrate is a silicon substrate.

3. The method of claim 1 wherein the low voltage device area is used to manufacture a low threshold voltage MOS transistor, and the high voltage area is used to manufacture a high threshold voltage MOS transistor.

4. The method of claim 1 wherein a thickness of the gate oxide layer in the low voltage device area is less than a thickness of the gate oxide layer in the high voltage device area.

5. The method of claim 1 wherein the bottom electrode of the capacitor is composed of in-situ doped polysilicon.

6. The method of claim 1 wherein after depositing the polysilicon layer (PL1), the method further comprises performing an ion implantation process to dope the polysilicon (PL1) layer.

7. The method of claim 1 further comprising a first angled ion implantation process and a second angled ion implantation process to form a P-type pocket doping area at either side of each bit line.

8. The method of claim 1 wherein a thickness of the ONO dielectric layer ranges between 100 to 500 angstroms.

9. The method of claim 1 wherein a polysilicide layer is disposed atop the polysilicon layer.

10. The method of claim 1 wherein the read only memory area is a mask ROM (MROM) area.

* * * * *